United States Patent [19]
Nevill et al.

[11] Patent Number: 6,003,149
[45] Date of Patent: Dec. 14, 1999

[54] TEST METHOD AND APPARATUS FOR WRITING A MEMORY ARRAY WITH A REDUCED NUMBER OF CYCLES

[75] Inventors: Leland R. Nevill; Ray Beffa, both of Boise, Id.; Ken Waller, Garland, Tex.; Eugene H. Cloud, Boise; Warren M. Farnworth, Nampa, both of Id.

[73] Assignee: Micron Technology, Inc., Boise, Id.

[21] Appl. No.: 08/917,215

[22] Filed: Aug. 22, 1997

[51] Int. Cl.[6] .................................................. G11C 29/00
[52] U.S. Cl. .......................................... 714/718; 714/733
[58] Field of Search ................................... 714/718, 720, 714/733; 365/200, 49

[56] References Cited

U.S. PATENT DOCUMENTS

| | | | |
|---|---|---|---|
| 5,293,386 | 3/1994 | Muhmenthaler et al. | 371/21.1 |
| 5,297,087 | 3/1994 | Porter | 365/201 |
| 5,488,583 | 1/1996 | Ong et al. | 365/201 |
| 5,764,576 | 6/1998 | Hidaka et al. | 365/200 |
| 5,828,593 | 10/1998 | Schultz et al. | 365/49 |

OTHER PUBLICATIONS

Han, S.H., et al., "Two–Dimensional Multiple–Access Testing Technique for Random–Access Memories", *IEEE*, 248–251, (1986).

Kraus, R., et al., "Design for Test of MBIT DRAMs", *IEEE Int'l Test Conference*, 316–321, (1989).

*Primary Examiner*—Phung M. Chung
*Attorney, Agent, or Firm*—Schwegman, Lundberg, Woessner & Kluth P.A.

[57] ABSTRACT

A method of testing a memory array is disclosed, the method comprising writing a test pattern to the memory array in as few as one or two RAS cycles by first activating the input/output data lines and then selectively activating multiple rows and columns. The method can be used with a variety of test environments. For example, the disclosed method may be implemented in testing using automated test equipment, and may also be incorporated in devices having built-in self-test circuitry. The disclosed method reduces the time required to test the memory array with minimal additional circuitry and no encroachment on valuable die real estate.

35 Claims, 5 Drawing Sheets

| 0 | 0 | 0 | 0 |
| 1 | 1 | 1 | 1 |
| 0 | 0 | 0 | 0 |
| 1 | 1 | 1 | 1 |
FIG. 3
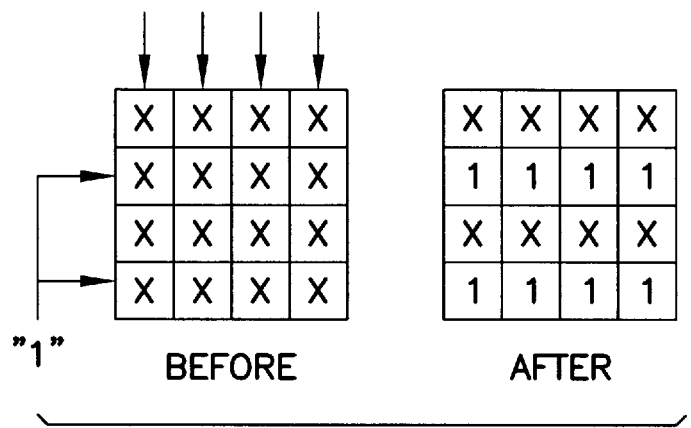
FIG. 3A
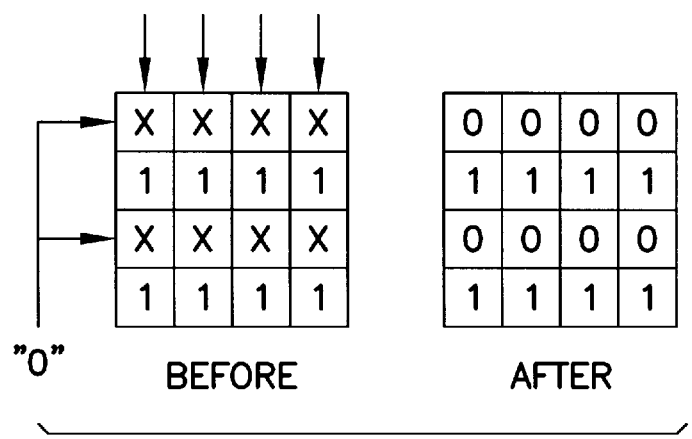
FIG. 3B

|1|0|1|0|
|---|---|---|---|
|0|1|0|1|
|1|0|1|0|
|0|1|0|1|
FIG. 4
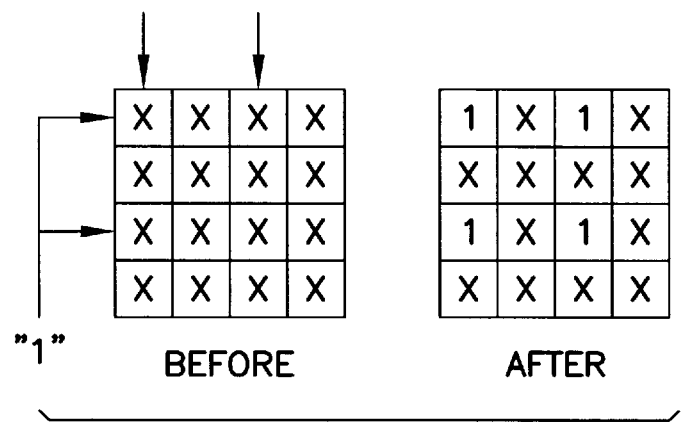
FIG. 4A
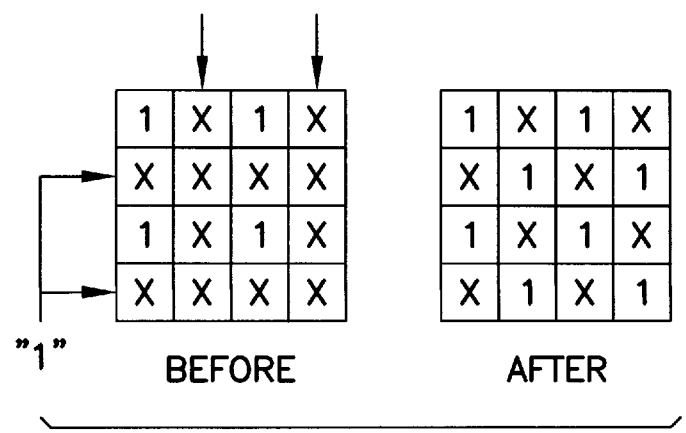
FIG. 4B

TEST METHOD AND APPARATUS FOR WRITING A MEMORY ARRAY WITH A REDUCED NUMBER OF CYCLES

FIELD OF THE INVENTION

The present invention relates in general to methods and apparatus for testing memory arrays, and particularly to improving memory test performance by reducing the number of read/write cycles.

BACKGROUND OF THE INVENTION

A typical memory array is constructed of multiple memory cells arranged in a matrix of columns and rows which are respectively correlated to bit lines and word lines. Each individual memory cell is located at the intersection of a particular word line and bit line. The memory cell is accessed by referencing that location or address. Each memory cell can hold one of two values, a "1" or a "0". After a memory array is manufactured it must be tested in order to identify which memory cells, if any, are defective. The primary concern is to detect faults that will cause a memory device to function incorrectly. Faults typically tested for include stuck-at faults, coupled-cell faults and single-cell pattern-sensitivity faults.

One method of testing memory devices is to write a specific pattern of "1"s and "0"s and then read the cells to see if there are any unexpected values. For example, a checkerboard pattern can be used to test for single-cell pattern sensitivity faults. A pattern of alternating "0"s and "1"s evaluates individual cells for defects such as charge leakage. Writing a "1" to one cell and "0"s to the surrounding cells tests the first cell's ability to hold the charge. In another example, row-stripes and column-stripes patterns may be used to test coupled-cell faults. Most test procedures address the set of faults most likely to occur rather than attempting to identify every possible fault, incorporating the appropriate series of test patterns.

Conventional memory testing is primarily performed in one of three methods. The first method uses automatic test equipment (ATE). According to this method all test-related circuitry and control and test data is external to the memory device. ATE testing is only performed on memory devices before they are incorporated into a system or other structure. The second test method, called built-in self-test (BIST), incorporates the test circuitry and data into the chip along with the memory device or devices. BIST allows the memory array to be tested at any point in the memory device's useful life. The third method of testing is a hybrid of the other two methods. Referred to as 'designed for testability' (DFT), this method implements parts of the test circuitry on the chip, the rest being provided externally in a conventional application of hardware and control and test data. The ever-increasing costs of testing memory devices demands continuing advancements in test methods and procedures.

There are tradeoffs associated with each type of memory test method. ATE testing may be slower than the others and usually only provides for testing memory devices before they are integrated into a system. ATE testing provides no on-going verification of memory integrity. The benefit of ATE testing is that none of the valuable die real estate on the chip is taken up with testing circuitry—the entire chip area can be dedicated to the memory function.

DFT may be faster than ATE testing by virtue of the fact that the most memory cell input/output intensive circuitry is incorporated into the device itself. So, even though a portion of the test circuitry and data is still external to the memory device, the test processing is faster than that achieved with ATE processing. The DFT method also minimizes the impact on available die real estate by selectively incorporating test circuitry into the memory device.

BIST incorporates all required test circuitry and control and test data in the memory device itself, which has the effect of either reducing the area available for memory cells or forcing an increase in the overall size of the die. Activating the BIST circuitry also requires additional control signals. When additional pins are fabricated into the device the user can test the chip during its operational life. Since all test circuitry is incorporated into the device, the device spends much less time on the test equipment during the manufacturing process. BIST provides memory device testing that is both easier and faster than testing methods external to the memory device. BIST devices are used primarily for embedded memories where neither the address, read/write, nor data input lines are externally observable. Depending upon the BIST architecture, which determines when the testing actually occurs, memory access times may be impacted by the self-test processing. Unlike DFT, BIST can only perform algorithms built into the BIST hardware. BIST is currently the preferred method, however. The increase in hardware overhead and the inflexibility with regard to test algorithms is the accepted cost of achieving the significant reduction in test times, as well as the capability to perform BIST without external support and at the operational speed of the circuit.

In a conventional memory array, an external read or write operation is limited in the number of memory cells which can be addressed at one time. As a result, testing methods such as ATE and non-concurrent BIST, which write to and read from every memory cell, require a larger number of external cycles to test a memory device. Reading from or writing to a memory cell is relatively slow, leading to the situation where conventional testing techniques are less efficient because of the large number of external cycles. There is a need in the art for a test method which provides the same level of fault coverage in a reduced number of external read/write cycles. There is a further need in the art to provide a way to improve the performance of memory tests, thereby increasing the efficiency of the manufacturing process and expanding the ability to incorporate more extensive algorithms in the selected test method by using a test method which provides the same level of fault coverage in a reduced number of external read/write cycles.

One partial solution is presented by Sang H. Han and Miroslaw Malek in *Two-Dimensional Multiple-Access Testing Technique for Random-Access Memories*, 248 Proc. IEEE Int. Conference on Computer Design (1986). Their method proposes three test access modes and a modified address decoder which can be set to simultaneously select k output lines. Mode-0 is the conventional 'one access per memory cell' process. Mode1 accesses k memory cells in one selected row at a time. Mode2 allows the test to access k cells in each of k rows at a time. Mode1 proved to speed up the test by k times, and Mode2 by $k^2$ times. Ham's system provides some relief to the burden of memory testing, but the system is limited to reading or writing blocks of data according to the number of input lines available, providing only an incremental improvement in test speed. As a result, Han's and Malek's system provides only partial relief to the ever-increasing cost of testing. There remains a need to improve test performance.

In 1989, Ranier Kraus, et al. in *Design for Test of Mbit DRAMs*, 316 Proc. IEEE Int. Test Conference (1989), presented another partial solution which increased the performance of BIST procedures by as much as 75% for 4 Mbit DRAM devices. Kraus' process also executes at three levels or modes. In Mode1, predefined test patterns are written into the entire memory array and tested automatically in parallel. Since an internal address counter is used, this method is the fastest of the three, having the least number of external cycles. Mode2 is more flexible, allowing patterns to be assembled individually by addressing each word line externally. This process is much slower than Mode1 because it has a significantly increased number of external cycles over Mode1. Mode3 is the worst performer of the three modes. It tests margins and is used in conjunction with Mode1, Mode2, or any conventional test. Kraus' method requires circuitry comprising a test comparator, a test pattern generator, and a modified column predecoder and column decoder. At the 4 Mbit level this translates to about 1% of the chip area being dedicated to the test circuitry, except in cases where all bits are either "1" or "0", in which case a parallel read or write can be performed in two external cycles.

Kraus was able to drastically improve the time required to test memory devices, but only by incurring significant cost of additional manufacturing to incorporate the test circuitry into the chip, reduced die real estate available for memory cells, and inflexibility due to the requirement that the test patterns be predefined into the test pattern generator. Thus the cost of testing was not so much reduced by Kraus as shifted. What is still needed is a test method which has less impact on die real estate and which maintains or improves upon the test processing speed. More flexibility in test logic is also needed, such that test patterns may be developed and integrated into the test processing at any point. Kraus' system is employed primarily in BIST devices. What is needed is a test method which achieves the same or similar performance improvements in all test architectures (ATE, DFT, and BIST), reducing the cost of memory device testing.

SUMMARY OF THE INVENTION

The present invention teaches a method for reducing the number of external cycles required to write a test pattern to a memory device without appreciably increasing the circuitry overhead. The method of the present invention improves over conventional methods in that any test pattern can be flexibly applied. There is no limitation tied to the number of input lines or pre-established blocks of pattern data.

According to one embodiment of the present invention, the circuitry of the column and row decoders is modified to enable the selective activation of multiple rows and/or columns in any one external cycle, According to one aspect of the present invention, a test pattern is written to a memory array by turning on the data input/output (I/O) lines and then selectively turning on one or more rows and two or more columns, causing the value on the I/O lines to be simultaneously written to the cells at the intersection of the activated rows and columns. Where a column stripes pattern is used, for example, the pattern can be loaded in as few as two RAS cycles. The number of RAS cycles required for other patterns is similarly significantly reduced as compared to the cycles required to load the same pattern using conventional methods. The cost of testing is dramatically reduced as one result of retaining reduced-cycle test processing speed without incurring any of the costs associated with dedicated test circuitry manufactured in the memory device.

In one embodiment of the present invention the test pattern data is generated by the automatic test equipment (ATE) test system. In another embodiment the test pattern data is generated by a procedure executing on a processor, while in yet another embodiment the test pattern data is stored within a procedure executing on the processor.

With the exception of modifications to the decoder circuitry, the row, column, and input/output circuitry already present on the memory device are employed. The present invention may therefore be easily incorporated in any memory device to reduce overall test times. The required modifications consist of a small amount of additional circuitry to engage the test modes and to allow the decoders to select multiple rows and columns. According to one embodiment, the additional circuitry in the decoders is only activated in response to a test enable signal.

BRIEF DESCRIPTION OF THE DRAWINGS

FIG. 3 is a representation of a "column stripes" test pattern.

FIG. 3A is a representation of the contents of a memory array after executing one write cycle of a "column stripes" test pattern according to one embodiment of the present invention.

FIG. 3B is a representation of the contents of a memory array after executing a second write cycle of a "column stripes" test pattern according to one embodiment of the present invention.

FIG. 4 is a representation of a "checker board" test pattern.

FIG. 4A is a representation of the contents of a memory array after executing one write cycle of a "checker board" test pattern according to one embodiment of the present invention.

FIG. 4B is a representation of the contents of a memory array after executing a second write cycle of a "checker board" test pattern according to one embodiment of the present invention.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in detail sufficient to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Figure 1:
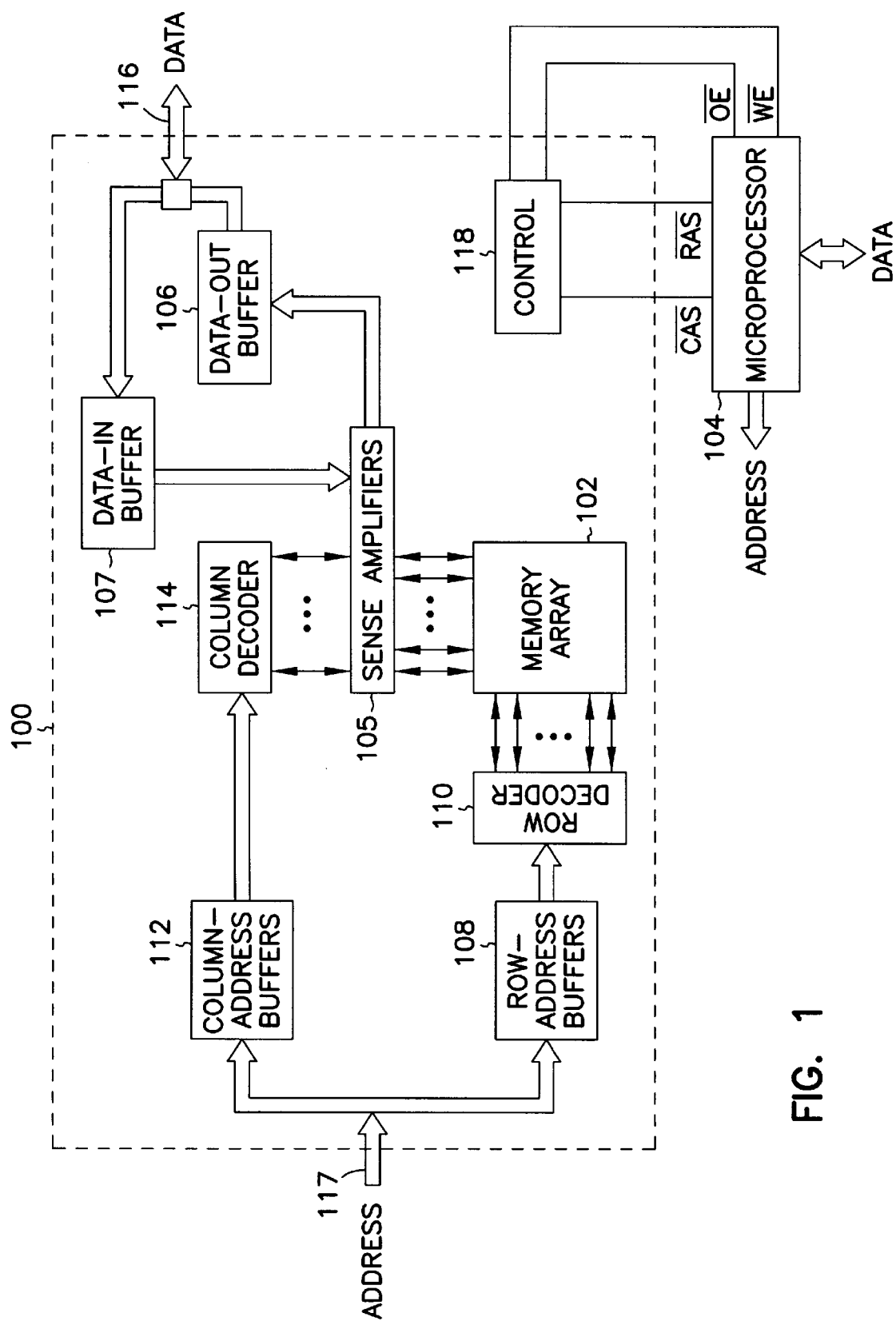
FIG. 1 is a block diagram of a memory device incorporating the present invention.

FIG. 1 shows the circuitry of a conventional memory device. In the embodiment shown, DRAM 100 includes a DRAM memory array 102 which can be accessed by microprocessor 104 through input/output connections including address lines 117. Those skilled in the art will recognize that, in an alternate embodiment, DRAM memory array 102 may be accessed by a DRAM controller (not shown) instead of microprocessor 104. DRAM array 102 includes rows and columns of randomly addressable memory cells. DRAM 100 is accessed through address bus 117, row and column address strobe signals RAS* and CAS*, write enable signal WE*, an output enable signal OE* and by using other conventional control signals (not shown) which are well known to those skilled in the art. Row address latch/buffer 108 and row decoder 110 receive and decode row addresses from row address signals provided on address lines. Each unique row address corresponds to a row of cells in DRAM memory array 102.

A row decoder consists of two basic elements, a wordline driver and an address decoder tree, and circuitry which translates a given row address received from row address buffers and selectively activates the appropriate wordline via wordline driver switch or transistor. According to one embodiment of the present invention, row decoder 110 incorporates additional circuitry which enables selective activation of multiple (or all) the rows in memory array 102. One conventional system for simultaneously biasing all of the row lines to a row stress voltage is described in U.S. Pat. No. 5,297,087, issued to Porter, and entitled "Methods and Devices for Accelerating Failure of Marginally Defective Dielectric Layers". Porter, however, describes biasing all rows in response to a particular applied voltage in order to test the physical limitations of the device elements. In contrast, the present invention is directed to efficiently testing the ability of the cells within the device, individually and collectively, to accurately receive and hold a value. In this regard, the system of the invention provides the heretofore unavailable feature of flexibly activating multiple rows and/or columns in a single external cycle. According to one embodiment of the present invention, the additional circuitry is only activated in response to a test enable signal For purposes of this discussion, an "external cycle" refers to an access request from microprocessor 104 (or DRAM controller). According to one embodiment of the present invention, during one external cycle a number of events are triggered within the device. In conventional circuitry, only one row and one column are activated during one external write cycle. The present invention incorporates additional circuitry in decoders 110, 114 which, in one embodiment, provides the ability to activate multiple rows and/or columns in a single external cycle through initiating additional internal events.

In a further embodiment the additional circuitry of the present invention is selectively activated in response to a particular signal received during memory access operations. In one embodiment, the signal is a test mode enable signal, derived as is well-known in the art. According to one implementation, the test enable signal is a super voltage applied as is known in the art. Those skilled in the art will recognize that other methods of signaling to activate the additional circuitry may be used without exceeding the scope and spirit of the present invention. Conventional technology is limited by the physical characteristics of circuit wiring in how much power may be bussed at any one time to fire rows. According to one embodiment of the present invention, when the pattern calls for activating a large number of rows power is applied in one external cycle. During that one external cycle a series of events internal to the device are triggered to sequence on the requested rows. In contrast to the present invention, conventional systems are required to run one external cycle for every row activation.

Column address latch/buffer 112 and column decoder 114 receive and decode column address signals provided on address lines 117, enabling access to the cell columns of DRAM memory array 102. Using circuitry similar to that incorporated in row decoder 110, column decoder 114 provides the ability to access multiple columns in a single external cycle. According to one embodiment of the present invention, only negligible additional power is required to activate multiple columns because the column select signal only needs to drive to Vcc.

During an external write cycle, data bus 116, comprising a plurality of input/output (I/O) lines, receives memory data which is to be written to DRAM memory array 102. Likewise, during an external read cycle data held in DRAM 100 can be transferred out on data bus 116. Control logic 118 is used to control the many available functions of DRAM 100. In addition, various control circuits and signals not detailed herein initiate and synchronize DRAM 100 operation as known to those skilled in the art.

As stated above, the description of DRAM 100 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

To generate test patterns, some conventional test systems employ additional circuitry comprising specialized pattern generators, some are limited to a few specific test patterns, and others employ methods which require an excessive number of external cycles to perform. According to one embodiment of the present invention, however, test patterns are written to a memory array in a reduced number of external cycles. Test patterns comprise a series of patterns of data values such as "1"s and "0"s. In one embodiment of the present invention, test patterns are presented to DRAM 100 through I/O lines 116. This allows the system of the invention to easily apply any one of a plethora of test patterns to a memory array. According to one embodiment of the present invention, the test patterns are generated algorithmically by automatic test equipment (ATE) and then presented to the memory array through I/O lines 116. In another embodiment, supporting field testing of memory devices, the test patterns are generated by an external processor and then presented to the memory array through I/O lines 116.

Figure 2:
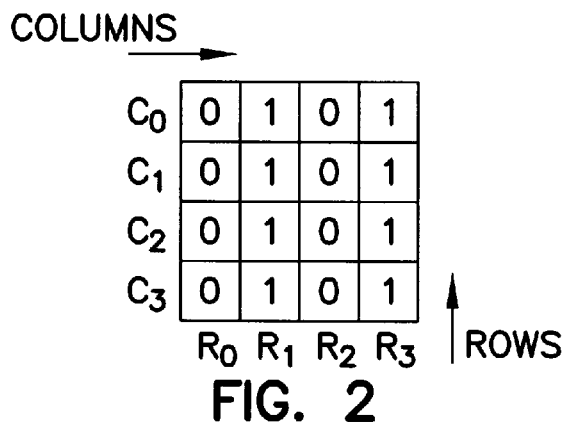
FIG. 2 is a representation of a "row stripes" test pattern.
Figure 2A:
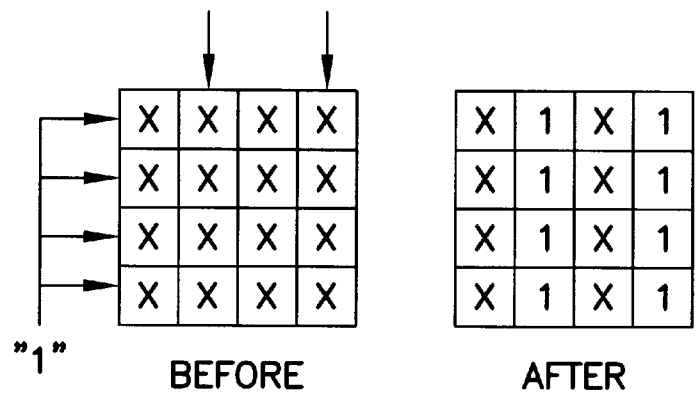
FIG. 2A is a representation of the contents of a memory array after executing one write cycle of a "row stripes" test pattern according to one embodiment of the present invention.
Figure 2B:
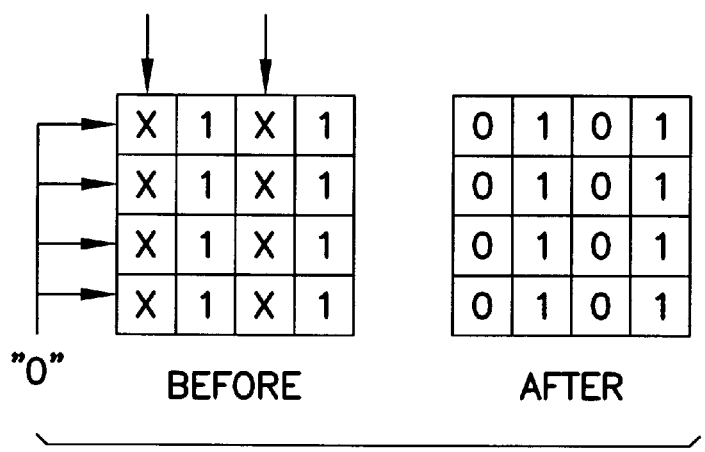
FIG. 2B is a representation of the contents of a memory array after executing a second write cycle of a "row stripes" test pattern according to one embodiment of the present invention.

The cells to which any one pattern are to be written are selected by activating a combination of rows and columns in DRAM memory array 102 through modified decoders 110, 114. In one example, a "row stripes" data pattern (shown in FIG. 2) is written to DRAM memory array 102 in two external cycles. In FIG. 2, the rows are depicted vertically and the columns are depicted horizontally. In the embodiment represented in FIG. 2, it is assumed that the state of array 102 is not known at the start of the test. Cells having this state are represented by an "X" in the Figure. When the memory device is a DRAM or similar device, the I/O lines are first brought to a "1" state. Then, in a first external write cycle, all of the columns and a selected set of rows, identified according to a first subset of the test pattern, are turned on during a sequence of one or more internal events through the respective decoders 114, 110. For the example shown, where multiple rows are to be activated in a single external cycle, the external write directs a signal to the memory device and into the modified decoders. A series of internal events are then triggered to sequence on the requested rows. This writes a first pattern of "1"s to the memory array as shown in FIG. 2A. The first set of rows are then turned off and the I/O lines are brought to a "0" state. In a second external write cycle the remaining cells are selected by turning on, during a sequence of one or more internal events, all of the columns and the rows containing the remaining unwritten cells, thereby writing a "0" to the remaining cells and completing the test pattern (FIG. 2B). The net result is that the row stripes pattern can be written to the device in two external RAS cycles.

FIG. 3 illustrates another example of a pattern which can be written in two external RAS cycles. To accomplish this so-called "column-stripes" pattern in two external cycles, the I/O lines are brought to a "1" state. In a first external write cycle all of the rows and a selected set of columns are turned on through decoders 114, 110, respectively. This results in a "1" being written to the selected cells in the pattern shown in FIG. 3A. In the same manner, during the second write cycle the I/O lines are brought to a "0" state, and all of the rows and the remaining columns are turned on. This results in a "0" being written to the remaining cells (FIG. 3B).

The preceding examples are offered for explicatory purposes only, and are not intended to limit the scope of the present invention in any way. One skilled in the art will recognize that the process of the present invention can be employed with a variety of test patterns, and that a number of test patterns can be written in as few as two cycles.

As can be seen, the present invention provides a memory test method which is more efficient. Conventional methods require a number of external cycles to complete a test. One commonly used conventional method is the row copy method, which requires an external cycle for each row copied. Since memory devices typically have four or more rows of memory cells, there can be a significant difference in the number of external cycles required to test a memory array using conventional methods over those described by the present invention. One of the novel features of the present invention is that, instead of addressing the pattern row by row, the pattern is addressed as an arrangement of one or more subpatterns, where the cells in each subpattern hold the same value.

FIG. 4 shows another example of a memory test processed according to one embodiment of the present invention. In this example, a checkerboard-type pattern is written to the memory device in four external cycles. First, after the I/O lines are brought to a "1" state, in the first external write cycle a first subset of test pattern data is written to a first set of rows and columns as shown in FIG. 4A by selectively turning on the selected rows and columns through their respective decoders 110, 114. With the I/O lines still at a "1" state, a second external write cycle is initiated. During this cycle a second subset of test pattern data is written by turning on a second set of rows and columns. For this particular pattern, the intersections of this second set of rows and columns identify the remaining cells in which a "1" is to be written. As shown in FIG. 4B, this completes the first half of the pattern.

Figure 4C:
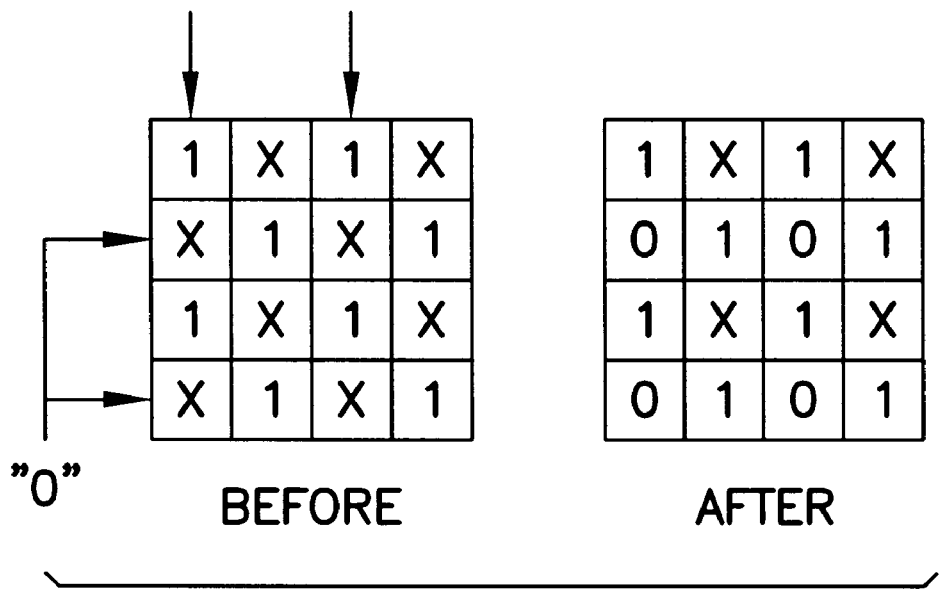
FIG. 4C is a representation of the contents of a memory array after executing a third write cycle of a "checker board" test pattern according to one embodiment of the present invention.
Figure 4D:
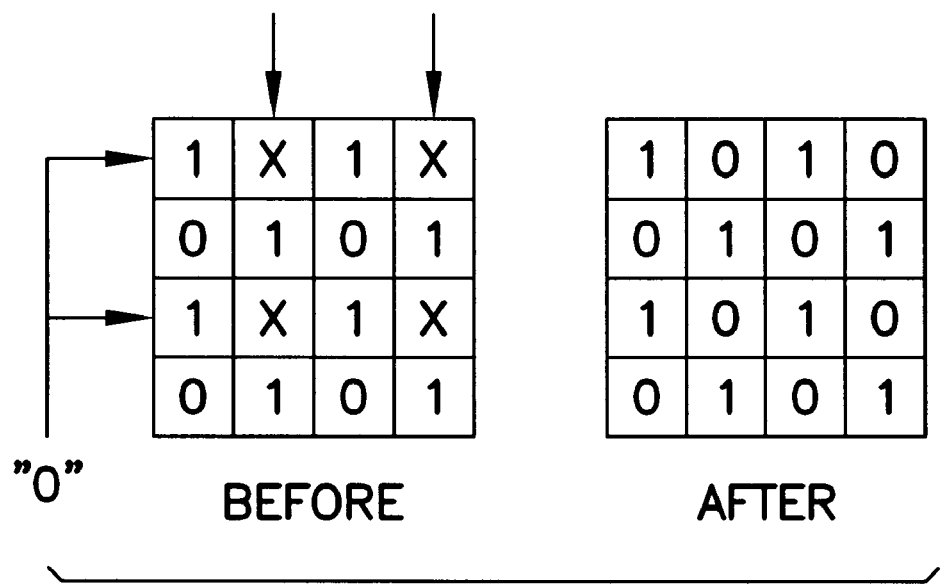
FIG. 4D is a representation of the contents of a memory array after executing a fourth write cycle of a "checker board" test pattern according to one embodiment of the present invention.

Next, the I/O lines are brought to a "0" state. In the third external write cycle for this test pattern, another set of rows and columns is turned on, writing a "0" to the selected cells. This completes the third set of test pattern data as shown in FIG. 4C. Finally, with the I/O lines still at a "0" state, a fourth set of rows and columns is selected in a fourth external write cycle. This set of rows and columns, selected according to which intersections identify the remaining unwritten cells, is then turned on, writing a "0" to those remaining cells and completing the pattern (FIG. 4D) in four external cycles.

Those skilled in the art will recognize that the present invention enables any test pattern to be written to a memory device in a minimum number of cycles. The ability to generate any pattern by turning on selected combinations of rows and columns provides flexibility not presently available with conventional test patterning systems. The performance of test processing according to the present invention is also faster than conventional test processing due to the reduced number of cycles required to perform the test processing. Unlike conventional row copy methods, more than one row can be written for each RAS cycle because the pattern is written to the die according to the concurrent selective activation of multiple rows and multiple columns.

The system of the invention has the additional benefit of being able to be integrated into any of the general test methods such as ATE, DFT, and BIST. Where it is incorporated into BIST the hardware overhead is reduced over other test processing because the row, column, and input/output circuits used by the system of the invention are part of conventional device circuitry and the amount of additional circuitry required is minimized. Since the test patterns do not have to be precompiled or stored in a test pattern generator, the present invention is adaptable to a variety of testing needs. The performance improvements are a direct result of the minimization of the number of external cycles using existing circuitry. The number of cycles required for a 4 Mbit memory device can be as low as one cycle for each distinct row pattern of "1"s and "0"s.

It is to be understood that the above description is intended to be illustrative, and not restrictive. Many other embodiments will be apparent to those of skill in the art upon reviewing the above description. The scope of the invention should, therefore, be determined with reference to the appended claims, along with the fill scope of equivalents to which such claims are entitled.

What is claimed is:

1. A method for testing a memory, the memory having a plurality of input/output lines and a plurality of rows and columns of memory cells, the method comprising the steps of:

identifying a test pattern, the test pattern consisting of a plurality of subpatterns, wherein the test pattern is composed of a plurality of data values, wherein each one of the plurality of subpatterns consists of a pattern of cells having the same data value, and wherein the pattern of cells in each one subpattern corresponds to a pattern of intersections of two or more of the plurality of columns of memory cells and one or more of the plurality of rows of memory cells; and for each one of the plurality of subpatterns, writing the subpattern to the plurality of rows and columns by performing in one external cycle the substeps;
driving the input/output lines to the data value of the subpattern;
activating the two or more columns corresponding to the subpattern; and
activating the one or more rows corresponding to the subpattern.

2. The method of claim 1, further comprising the step of initiating a test mode in the memory array in response to a test enable signal.

3. The method of claim 1, wherein the step of identifying a test pattern further comprises identifying a test pattern with automatic test equipment.

4. The method of claim 1, wherein the step of identifying a test pattern further comprises identifying a test pattern with an external processor.

5. The method of claim 1, wherein the step of identifying a test pattern further comprises identifying a test pattern with an internal BIST (Built In Self Test) control circuit on the memory.

6. The method of claim 1, further comprising the step of preventing the activation of more than one row and one column as long as the memory is not initialized in a test mode.

7. A method for testing a memory array having a plurality of rows and columns of memory cells, the memory array receiving data through a plurality of input/output lines, the method comprising:
identifying a test pattern having one or more distinct column patterns, wherein each distinct column pattern includes one or more data values;
identifying which of the plurality of columns contain which of the one or more distinct column patterns;
for each of the one or more data values in each of the one or more distinct column patterns, executing in one external cycle:
driving the input/output lines to the value used in the distinct column pattern;
activating one or more of the plurality of rows according to the distinct column pattern; and
activating the one or more of the plurality of columns identified as containing the distinct column pattern.

8. The method of claim 7, further comprising the step of preventing the activation of more than one row and one column so long as the memory is not initialized in a test mode.

9. The method of claim 7, further comprising the step of initiating a test mode in the memory array in response to a test enable signal.

10. A memory device having a memory array having rows and columns of memory cells and having test circuitry connected thereto, the memory device comprising:
a row decoder having test circuitry for selectively activating two or more rows of memory cells simultaneously; and
a column decoder having test circuitry for selectively activating two or more columns of memory cells simultaneously.

11. The memory device of claim 10, further comprising means for selecting a plurality of rows of memory cells and a plurality of columns of memory cells according to one of a plurality of test modes.

12. The memory device of claim 10, further comprising activation means responsive to a test enable signal, wherein the test circuitry in the row decoder for selectively activating two or more rows of memory cells simultaneously and the test circuitry in the column decoder for selectively activating two or more columns of memory cells simultaneously is inactive until the test enable signal is received.

13. The memory device of claim 10, wherein the memory device comprises a dynamic random access memory (DRAM) device.

14. The memory device of claim 10, wherein the row decoder selectively activates two or more rows of memory cells based on a test pattern generated by automatic test equipment.

15. The memory device of claim 10, wherein the column decoder selectively activates two or more columns of memory cells based on a test pattern generated by automatic test equipment.

16. The memory device of claim 10, wherein the row decoder selectively activates two or more rows of memory cells in one external cycle.

17. The memory device of claim 10, wherein the column decoder selectively activates two or more columns of memory cells in one external cycle.

18. A system for testing a memory device, comprising:
a processor generating a test pattern composed of a plurality of data values, the test pattern having one or more subpatterns, wherein each subpattern includes one or more of the plurality of data values;
a connection interface electrically connecting a memory device to the system, the memory device having a row decoder having circuitry for selectively activating two or more rows of memory cells simultaneously; and a column decoder having circuitry for selectively activating two or more columns of memory cells simultaneously; and
a circuit operable in one external cycle for writing each one of the one or more subpatterns to the memory device.

19. The system of claim 18, wherein the system is an external automatic test equipment (ATE) system.

20. The system of claim 18, wherein the memory device is a dynamic random access memory (DRAM) device.

21. A method for testing memory having a plurality of input/output lines and a plurality of rows and columns of memory cells, comprising:
enabling a test mode;
driving the plurality of input/output lines to a data value in one external cycle;
activating two or more columns corresponding to the data value in the external cycle during the test mode; and
activating one or more rows corresponding to the data value in the external cycle during the test mode.

22. The method of claim 21, wherein the data value corresponds to a subpattern of a test pattern.

23. The method of claim 21, further comprising receiving the data value from an automatic test equipment.

24. The method of claim 21, further comprising receiving the data value from an external processor.

25. The method of claim 21, further comprising receiving the data value from an internal BIST (Built In Self Test) control circuit on the memory.

26. A method for testing memory having a plurality of input/output lines and a plurality of rows and columns of memory cells, comprising.
placing the memory into a test mode;
driving the plurality of input/output lines to a data value in one external cycle;

activating one or more columns corresponding to the data value in the external cycle during the test mode; and activating two or more rows corresponding to the data value in the external cycle during the test mode.

27. The method of claim 26, wherein the data value corresponds to a subpattern of a test pattern.

28. The method of claim 26, further comprising receiving the data value from an automatic test equipment.

29. The method of claim 26, further comprising receiving the data value from an external processor.

30. The method of claim 26, further comprising receiving the data value from an internal BIST (Built In Self Test) control circuit on the memory.

31. A method for testing memory having a plurality of rows and columns of memory cells, the plurality of columns including a first subset and a second subset, comprising:

externally applying a signal to place the memory into a test mode;

setting the plurality of rows and the first subset of the plurality of columns to a first state;

turning on the plurality of rows and the first subset of the plurality of columns in a first external cycle during the test mode;

setting the plurality of rows and the plurality of columns to a second state; and turning on the plurality of rows and the second subset of columns in a second external cycle during the test mode.

32. A method for testing memory having a plurality of rows and columns of memory cells, the plurality of rows including a first subset and a second subset, comprising:

entering a test mode;

setting the plurality of columns and the first subset of the plurality of rows to a first state;

turning on the plurality of columns and the first subset of the plurality of rows in a first external cycle during the test mods;

setting the plurality of columns and the plurality of rows to a second state; and turning on the plurality of columns and the second subset of rows in a second external cycle during the test mode.

33. A memory device having a memory array having rows and columns of memory cells capable of operating in a test mode, the memory device comprising:

a row decoder having circuitry for selectively activating a first subset of the rows of memory cells simultaneously during the test mode; and a column decoder having circuitry for selectively activating a second subset of the columns of memory cells simultaneously during the test mode;

wherein the first subset and the second subset is more than one but less than a complete set.

34. The memory device of claim 33, further comprising means for selecting a plurality of rows of memory cells and a plurality of columns of memory cells according to one of a plurality of test modes.

35. The memory device of claim 33, further comprising activation means responsive to a test enable signal, wherein the circuitry in the row decoder for selectively activating the first subset of the rows of memory cells simultaneously during a test mode and the circuitry in the column decoder for selectively activating the second subset of the columns of memory cells simultaneously during the test mode is inactive until the test enable signal is received.

* * * * *